(12) United States Patent  
Kapusta (10) Patent No.: US 8,233,069 B2  
(45) Date of Patent: Jul. 31, 2012

(54) DITHERING TECHNIQUES TO REDUCE MISMATCH IN MULTI-CHANNEL IMAGING SYSTEMS

(75) Inventor: Ronald Kapusta, Waltham, MA (US)

(73) Assignee: Analog Devices, Inc., Norwood, MA (US)

( * ) Notice: Subject to any disclaimer, the term of this patent is extended or adjusted under 35 U.S.C. 154(b) by 427 days.

(21) Appl. No.: 12/544,671

(22) Filed: Aug. 20, 2009

(65) Prior Publication Data

US 2010/0149360 A1 Jun. 17, 2010

Related U.S. Application Data

(60) Provisional application No. 61/122,089, filed on Dec. 12, 2008.

(51) Int. Cl.
*H04N 5/335* (2011.01)
(52) U.S. Cl. .......................... 348/308; 348/241; 348/294
(58) Field of Classification Search .................. 348/294, 348/308, 241; 250/208.1; 341/131, 137, 341/155
See application file for complete search history.

(56) References Cited

U.S. PATENT DOCUMENTS

| | | | |
|---|---|---|---|
| 5,790,063 A * | 8/1998 | Koifman et al. | 341/155 |
| 2006/0278708 A1 | 12/2006 | Olmstead | |
| 2008/0055432 A1 | 3/2008 | Koseki | |
| 2010/0148878 A1 | 6/2010 | Kapusta | |
| 2011/0095923 A1 * | 4/2011 | Ignjatovic et al. | 341/137 |
| 2011/0148676 A1 * | 6/2011 | Waheed et al. | 341/131 |

OTHER PUBLICATIONS

You et al., A CMOS16-bit 20MSPS Analog Front End for Scanner/MFP Applications, IEEE Transactions on Consumer Electronics, vol. 49, No. 3, Aug. 2003.
International Search Report dated Mar. 3, 2010, in counterpart international application No. PCT/US2009/067621.

* cited by examiner

*Primary Examiner* — Tuan Ho
(74) *Attorney, Agent, or Firm* — Kenyon & Kenyon LLP (57) ABSTRACT

An embodiment of the present invention may be directed to a multi channel imaging system. The multi channel imaging system may include an input for a light signal and a plurality of channel circuits. Each of the channel circuits may have an analog signal processing chain converting some portion of the light signal into to a digital representation, the plurality of channel circuits may operate in parallel. The multi channel imaging system may further comprise at least one dither circuit coupled to a point in at least one of the analog signal processing chains to add dither.

30 Claims, 5 Drawing Sheets

DITHERING TECHNIQUES TO REDUCE MISMATCH IN MULTI-CHANNEL IMAGING SYSTEMS

CROSS-REFERENCE TO RELATED APPLICATIONS

This application claims priority to U.S. Provisional Patent Application No. 61/122,089, filed Dec. 12, 2008, entitled "Dithering Techniques to Reduce Mismatch in Multi-Channel Imaging Systems," which is herein incorporated by reference in its entirety.

BACKGROUND

Many digital imaging systems are moving towards multi-channel image processing as a means to increase throughput. For example, many CMOS image sensors will readout 4 channels of pixel data in parallel, achieving a 120 Mega pixels (Mpixel)/sec throughput, while each readout channel speed is only 30 Mpixel/sec.

While breaking the pixel processing into parallel paths allows improved throughput, it also can impair system performance. One such impairment involves mis-match among channels. In a multi-channel system, equivalent input to each channel should generate equivalent outputs from each channel. If the output data is not uniform in response to uniform inputs, the digitized image would not be an accurate representation of the captured light. Mis-match among the outputs could give rise to perceptual artifacts.

In digital imaging systems, the transfer function from input (light) to output (digital data) is often quite non-linear. Non-linear performance can be accommodated because the sensitivity of the human eye is also non-linear. In fact, this allows the system designer extra freedom, such as allowing for non-linear analog front-ends (AFEs), which can save power and cost as compared to highly linear AFEs. In multi-channel systems, it is often difficult to design non-linear AFEs that match well because non-linearity behavior is generally not well controlled. One AFE might be non-linear in one way, and the next could be non-linear in a different way. Thus, the matching between channels suffers and can lead to artifacts. Accordingly, there is a need for matching the outputs of channels of a multi-channel imaging systems.

DETAILED DESCRIPTION

Embodiments of the present disclosure use dither to improve matching between non-linear channels in digital imaging systems. Dither generally is defined as intentionally added noise. Dither may be deterministic, such as cycling through a prepared pattern, or random, such as based on a pseudo-random number generator. Embodiments of the present disclosure may apply dither in the analog domain, before analog pixel information is converted to digital data. Added dither may improve the matching between non-linear channels.

An embodiment of the present invention may be directed to a multi channel imaging system. The multi channel imaging system may include an input for a light signal and a plurality of channel circuits. Each of the channel circuits may have an analog signal processing chain converting some portion of the light signal into to a digital representation, the plurality of channel circuits may operate in parallel. The multi channel imaging system may further comprise at least one dither circuit coupled to a point in at least one of the analog signal processing chains to add dither.

Figure 1:
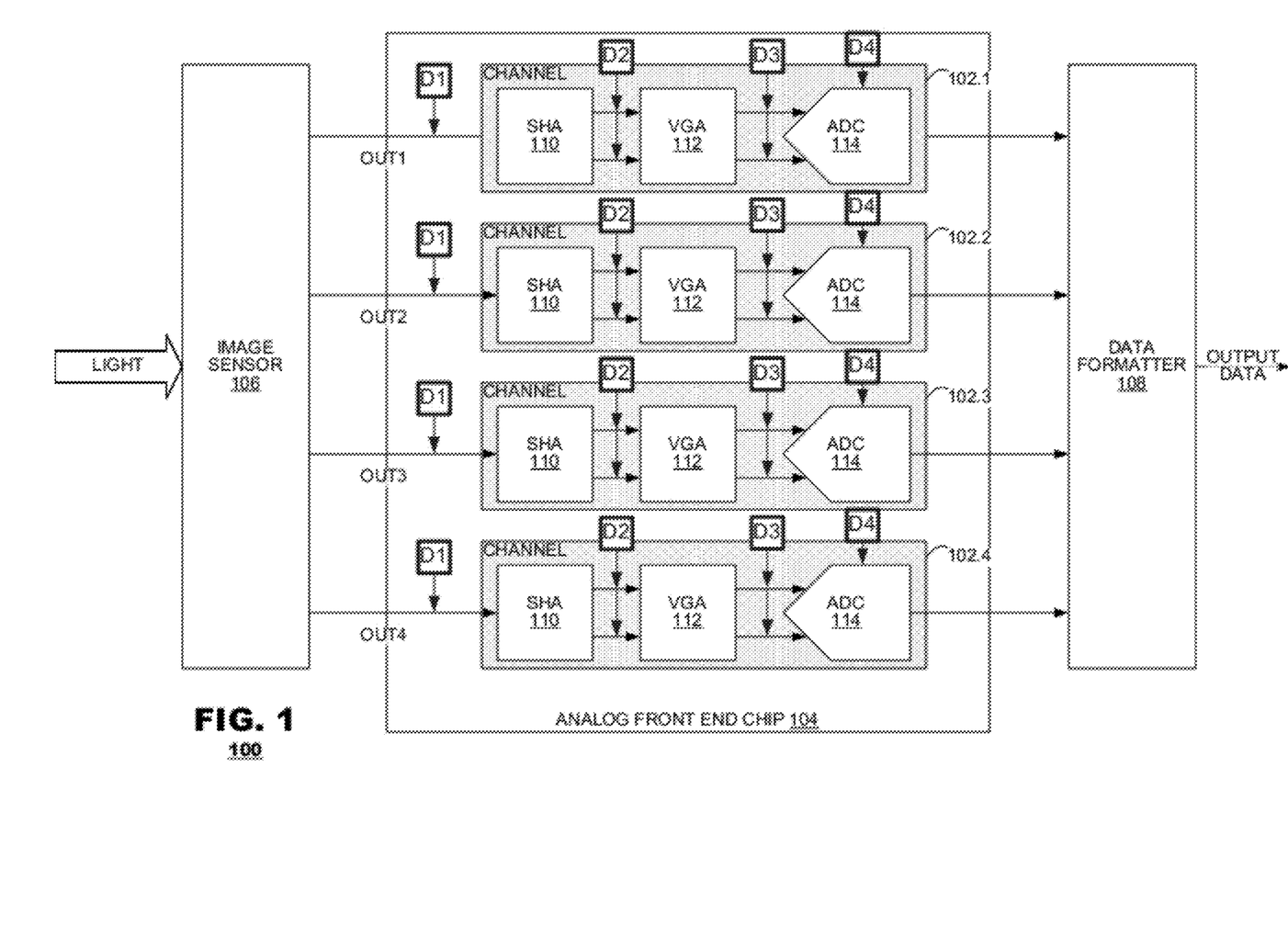
FIG. 1 is a system block diagram of a multi-channel imaging system.

FIG. 1 shows a block diagram for a multi channel imaging system 100. The multi channel imaging system 100 may include an image sensor 106 and an AFE 104. In the example illustrated in FIG. 1, the image sensor 106 is shown as a four channel image sensor and the AFE 104 is shown as a four channel AFE having channels 102.1-102.4. The image sensor 106 may include a plurality of light sensors, which generate analog signals in response to incident of light. Each channel 102 may include a sample and hold amplifier ("SHA") 110, a variable gain amplifier ("VGA") 112 and an analog to digital converter ("ADC") 114. The channels may generate digital output to a data format unit 108 in response to the analog signals—voltage or currents—provided on their inputs.

In an embodiment of the present invention, an AFE 104 may include dither sources D1-D4 coupled to the channels 102.1-102.4. During operation, the dither sources generate time-varying signal components to the analog signals that propagate within the channels 102.1-102.4. The dither appears as noise within the analog signals and mask mismatch effects that otherwise may be introduced between the channels 102.1-102.4. FIG. 1 illustrates several locations within a channel in which dither may be introduced. A dither source D1 may be provided at an input of the SHA 110. Alternatively, a dither source D2 may be provided at an interface between the SHA 110 and the VGA 112. As another alternative, a dither source D3 may be provided at an interface between the VGA 112 and the ADC 114 within the channel. Alternatively, a dither source D4 may be provided for use inside of the ADC 114. For example, ADC 114 could dither the ADC comparison thresholds (e.g., input levels at which the ADC output changes from one code to another code), so that a particular input signal may result in multiple output codes. By introducing dither at any of the processing locations shown in FIG. 1, the image signal may be integrated with dither signal prior to digitization.

Figure 2:
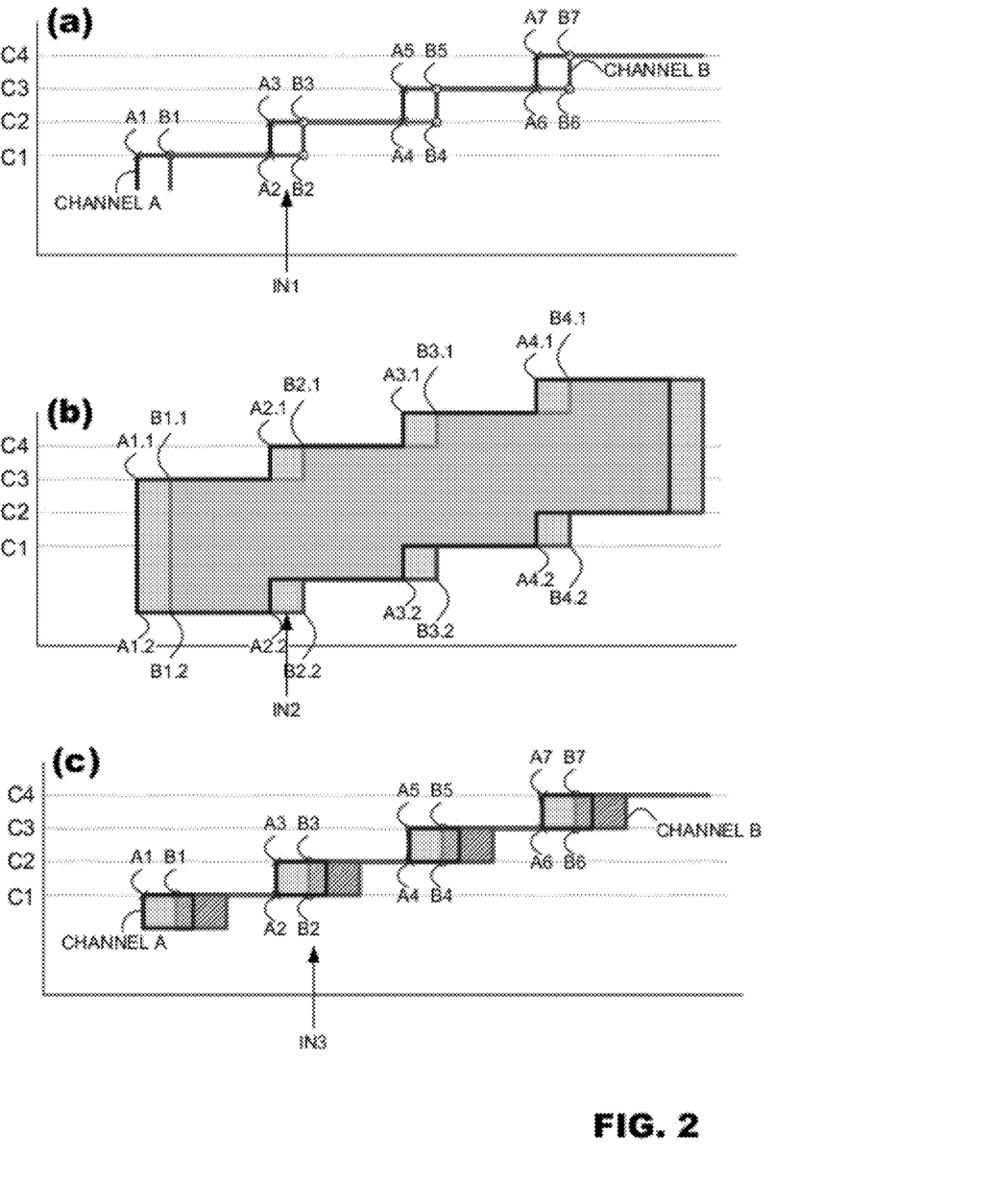
FIG. 2 shows two graphs illustrating dither reducing mismatch of channels according to one embodiment of the present invention.

FIGS. 2(a), 2(b) and 2(c) illustrate the effects of dither. FIG. 2(a) is a graph illustrating conversion effects that may occur in a multi-channel system without dither where incident light is represented along a first axis and an output code is represented on a second axis. A curve for a first channel (labeled "channel A") extends according to a step function that crosses points A1-A7. A curve for a second channel B extends according to a step function that crosses points B1-B7. These curves diverge at various points along the light axis. Incident light at value IN1, for example, would generate a first code value C2 from channel A but a second code value C1 from channel B.

FIGS. 2(b) and 2(c) illustrate effects that may be introduced by dither. In both FIGS. 2(b) and 2(c), dither causes conversion effects that are not represented by a single line but rather an area. In FIG. 2(b), the output of channel A may be represented by an area formed by points A1.1, A1.2, A2.1, ..., A4.1, A4.2. Similarly, the output of channel B may be represented by an area formed by points B1.1, B1.2, B2.1, . . . , B4.1, B4.2. Channel A may convert a given value of incident light (e.g., IN2) to one of several output codes. Similarly, Channel B may convert the same value of incident light to one of multiple output codes, some of which overlap with the output codes that would be generated by Channel A.

In FIG. 2(c), the output of both channels A and B at each vertical step (e.g., points A2 to A3 or B2 to B3 at code C2 to code C3) may be represented by an area covering two neighboring codes (e.g., code C2 and code C3). The area covered by channel A may overlap with the area covered by channel B around the vertical step, thus an input IN3 may result in either C2 or C3 for both channels. In one embodiment, the channel output of FIG. 2(c) may be caused by introducing dither D4 to move around the ADC thresholds.

During operation, the dither may be a time-varying signal having random or pseudo-random properties and, therefore, the variation in outputs of a single channel and among the multiple channels may appear as random noise. Thus, the perceptible artifacts may be reduced.

In one embodiment, non-linearity among channels of a multi channel imaging system may be measured. For example, the non-linearity between channels A and B of FIG. 2(a) may be represented by the difference for the strength of a light signal required for a certain code (e.g., the difference between A1 and B1 or A2 and B2). Because dither may be added to improve the non-linear effects among the channels, the magnitude of dither (e.g., added analog noise) may be selected based on the measured non-linearity. However, dither adds noise and may cause some other non-desirable effects, so it may be better not to add more than necessary. Thus, in one embodiment, the magnitude of dither may be chosen to correspond to the magnitude of measured non-linearity (e.g., 1 to 1). But dither may need to be as big or bigger than the errors it is used to mask/fix. Thus, in another embodiment, the magnitude of dither may be chosen to be larger than the magnitude of measured non-linearity (e.g., 2 to 1).

In one or more embodiments, the magnitude of non-linearity (or errors to mask/fix) may be known by design, thus, dither may be set to exactly that size (or slightly larger). In another embodiment, on the other hand, the size of the non-linearity (or errors) may be detected or determined during operation, such as, but not limited to, a calibration routine, the dither magnitude may be adjusted adaptively to match the non-linearity (or errors).

To keep the dither from adding excess noise to a multi channel imaging system, the added dither may be removed from converted digital signals. Because dither may be intentionally added to the system, it may be removed later. In one embodiment, the added dither may have a magnitude of one least significant bit (LSB) of (e.g., +1 or −1) inside an ADC. Once the input analog signal and the added dither is digitized, the known dither quantity may be removed (digitally subtracted). However, this may work when the magnitude of the added dither is precisely controlled.

In the embodiment illustrated in FIG. 1, the AFE 104 channels are shown as processing differential analog signals, which carry information content on a pair of differential signal lines. Information content may be carried as equal and opposite voltages centered about a common mode voltage or as equal and opposite currents centered about a common mode current. In such a case, the dither circuit D1, D2, D3 may be provided as a differential dither source.

Figure 3:
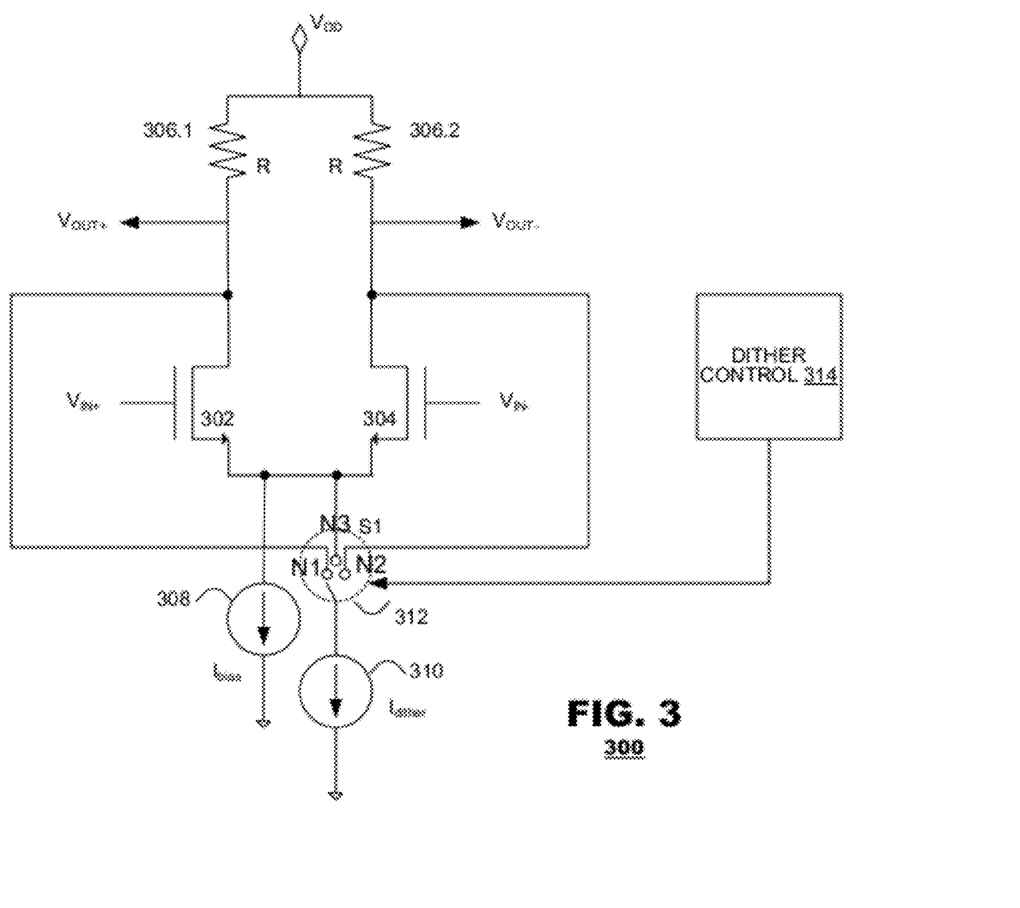
FIG. 3 shows a differential amplifier with dithering according to an embodiment of the present invention.

FIG. 3 shows a differential amplifier 300 with dither source according to an embodiment of the present invention. FIG. 3 is for illustrative purpose. In different embodiments, the amplifier may include other configurations, for example, only one signal path extending between an input signal and an output signal (not shown). Referring to FIG. 3, the amplifier 300 may include a pair of signal paths (first signal path from $V_{in+}$ to $V_{out-}$, the second one from $V_{in-}$ to $V_{out+}$) that include transistors 302, 304, load devices 306.1, 306.2 coupled respectively to the transistors 302, 304. The amplifier 300 further may include a bias current source 308 and a dither current source 310. The dither current source may be selectively coupled to nodes N1, N2, N3 within the amplifier circuit via a three-throw switch S1. The bias current source 308 may be coupled to sources of the transistors at a common node N3.

The bias current source 308 may provide an approximately constant bias current $I_{bias}$ to the amplifier 300 as in conventional differential amplifiers. The dither current source 310 may supply a dither current to a connected mode N1, N2 or N3. When the dither current source is connected to node N1, a dither current may be directly supplied to the load of $V_{out}$ which introduces a differential mode signal at the output. On the other hand, when the dither current source is connected to N2, a dither current may be directly supplied to the load of $V_{out+}$, which introduces a differential mode signal at the output in opposite orientation. When the dither current is connected to N3, the dither current is connected to the common node N3 along with the bias current $I_{bias}$, which introduces a common mode signal that could be rejected by subsequent signal processing. The dither current supplied by source 310 may be tuned to the range of the ADC; for example to represent a single least significant bit (LSB), a fraction of a LSB or multiple LSB (e.g., 10 LSBs) of the ADC conversion range.

During operation, the switch S1 may be connected to one of the three nodes (N1, N2, and N3) at a given time: to the $V_{out+}$ terminal (node N1), to the $V_{out-}$ terminal (node N2), or to a common node N3 coupling drains of the transistors 302, 304 to each other. For example, when S1 is switched to node N3 and the dither current $I_{dither}$ is connected to the common node, there is no differential offset to either side of the outputs. When S1 is switched to node N1, the dither current $I_{dither}$ is provided directly to load device 306.1 but not load device 306.2. The additional current may introduce a negative voltage offset at $V_{out-}$ in addition to the differential output signal ($V_{out+} - V_{out-}$) caused by the differential input signals ($V_{in+} - V_{in-}$) at transistors 302, 304. On the other hand, when S1 is switched to node N2, the dither current $I_{dither}$ is provided directly to load device 306.2 but not load device 306.1. The additional current induces a voltage offset at $V_{out+}$ in addition to the differential output signal ($V_{out+} - V_{out-}$) caused by the differential input signals ($V_{in+} - V_{in-}$) at transistors 302, 304. The positive and negative voltage offsets induced by switch S1 connecting to nodes N1 and N2 are opposite to each other. Accordingly, the dither circuit 310, 312 can induce offsets between the output terminals $V_{out+}$ and $V_{out-}$ in a first or second direction, or can be set so as not to introduce any offset at all.

In an embodiment, the amplifier 300 may include a dither control device 314 to control switching of S1 randomly among the three nodes (N1, N2, N3) for each sampling period of an ADC. For example, at the beginning of each sampling period of an ADC, the dither control 314 may generate a random number and a control signal based on the random number. The control signal may cause S1 to be randomly connected to one of the three nodes (N1, N2, N3).

The magnitude of $I_{dither}$ as shown in FIG. 3 may also be variably controlled by the dither control 314. As such, the magnitude of the added dither may be controlled by changing the magnitude of $I_{dither}$. In this way, not only the offset may be added to either side of the differential amplifier, but also the magnitude of the offset may be varied under the control of the dither control device.

In an embodiment of the present invention, the magnitude of the dither in connection with the amplitude of $I_{dither}$ may be controlled adaptively according to operating conditions of an integrated circuit in which the amplifier is provided. For example, the magnitude of $I_{dither}$ may be controlled proportionally to the clock frequency of the device. Providing larger dither at higher clock frequencies can counteract effects of non-linear component behavior in electronic devices which can increase at high clock frequency. In another embodiment, the magnitude of dither may be proportional to variations of the clock frequency. For example, the magnitude of dither may be higher for larger variations of the clock frequency. In another embodiment, the dither magnitude may also be made responsive to operating temperature. For example, the amplitude of $I_{dither}$ may be controlled proportionally to the temperature or to a rate of temperature changes such as temperature changes over time. In yet another embodiment, the dither magnitude may also be made responsive to process variations such as variations of capacitance and resistance within an integrated circuit or across manufacturing lots of a common integrated circuit.

In an embodiment, $I_{dither}$ may be a part of $I_{bias}$ rather than a separate current source. Under this scenario, switches may be used to steer a portion of $I_{bias}$ (as $I_{dither}$) to either side of the differential amplifier to generate dither noise to the output. To disable dither, the part of $I_{bias}$ used for dithering the amplifier may simply be kept connected to the common source node.

Figure 4:
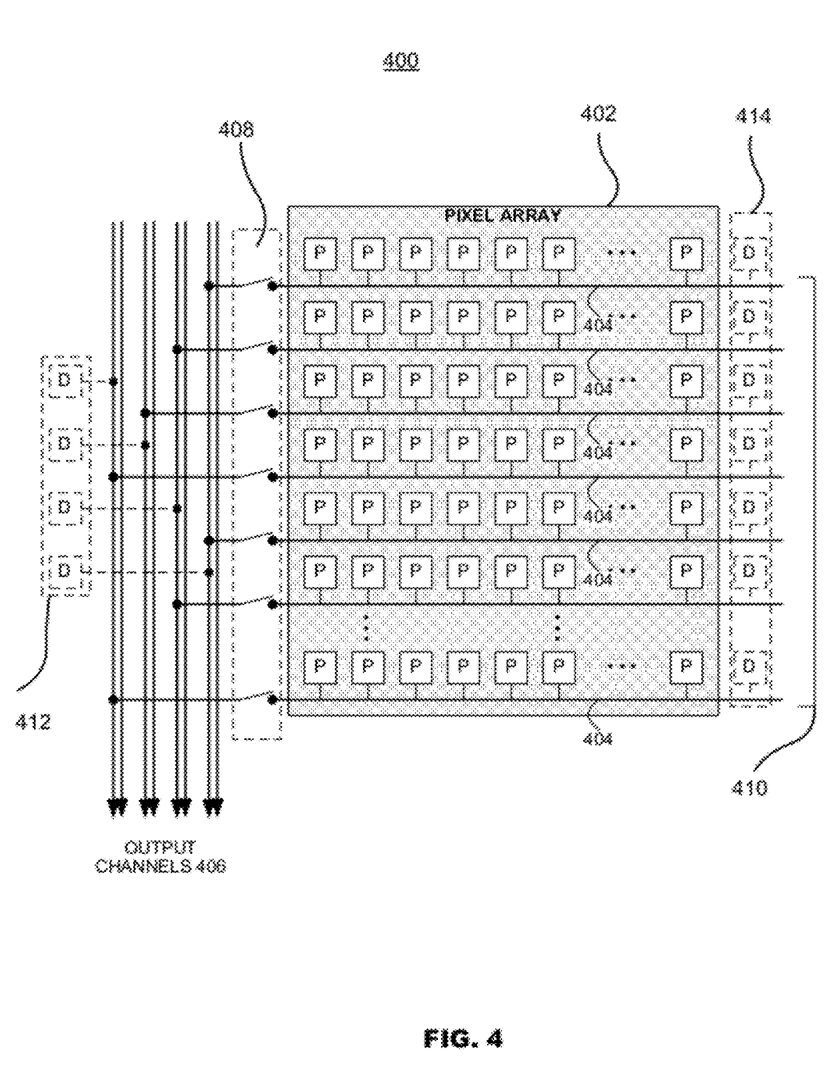
FIG. 4 shows dithering in an image sensor according to an embodiment of the present invention.

In an embodiment, the dither circuit may be integrated into the image sensor 400, as shown in FIG. 4. The multi-channel image system 400 may include a pixel array 402 including a plurality of pixel sensors P and a plurality of outputs 406. During a readout operation, accumulated charge from a pixel sensor may be switched to a bus 404 within the pixel array 402 via a switch (not shown) and further to an output 406 via a switch 408. The outputs 406 may be differential outputs.

In an embodiment, the image sensor further may include an integrated dither source that introduces dither to the pixels as they are read from the image sensor 400. The dither source D may be coupled to the outputs 406 (e.g., amplifiers driving the output signals) or, alternatively, to the switch array busses 404 as shown in FIG. 4. In an embodiment, the dither source may be provided as illustrated in FIG. 3.

Figure 5:
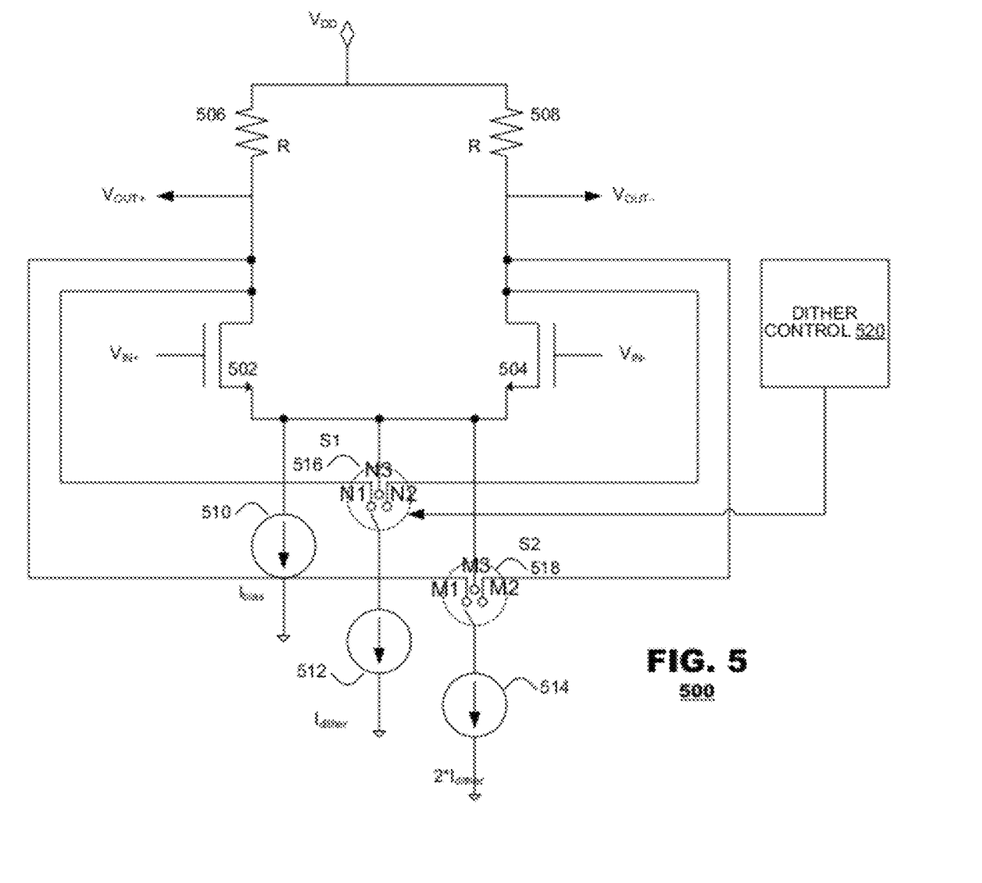
FIG. 5 shows a differential amplifier with dithering according to embodiments of the present invention.

According to another embodiment a differential amplifier may include a plurality of dither sources to generate multi-bit dithering. FIG. 5 shows an amplifier with 2-bit dither according to an embodiment of the present invention. The differential amplifier of FIG. 5 may include a pair of NMOS transistors (502, 504), diode loads (506, 508) coupled respectively to the transistors (502, 504), bias current source $I_{bias}$ (510) coupled to a common node connecting to the drains of the transistors (502, 504) and a plurality of dither current sources 512, 514. A first dither current $I_{dither}$ source (512) may be connected to one of the loads (506, 508) or the common node N3 via a first triple-throw switch S1 (516). A second dither current source may be selectively connected to one of the loads (506, 508) or the common node via a second triple-throw switch S2 (518) at nodes M1, M2, M3. In an embodiment, the dither sources 510, 512 may be scaled according to a binary weighting (e.g. $I_{dither}$, $2*I_{dither}$, etc).

During operation, the first switch S1 may be connected to one of three nodes of S1 (N1, N2, N3) at a given time: to the $V_{out+}$ terminal (node N1), to the $V_{out-}$ terminal (node N2), or to a common node N3 coupling drains of the transistors (502, 504). The switch S1 of FIG. 5 may provide negative or positive offset respectively to load devices 506 or 508 proportional to $I_{dither}$. Similarly, the second switch S2 may be connected to one of the three nodes of S2 (M1, M2, M3) at a given time to the $V_{out+}$ terminal (node M1), to the $V_{out-}$ terminal (node M2), or to a common node (M3) coupling drains of the transistors (502, 504). When S2 is switched to node M1, the dither current of $2*I_{dither}$ is provided directly to load device 506 but not load device 508. The additional dither current ($2*I_{dither}$) may introduce a negative voltage offset at $V_{out-}$ in addition to the differential output signal ($V_{out+}-V_{out-}$) caused by the differential input signals ($V_{in+}-V_{in-}$) at transistors (502, 504). The additional offset may be proportional to the magnitude of the dither current. On the other hand, when S2 is switched to node M2, the dither current $I_{dither}$ is provided directly to load device 508 but not load device 506. The additional current ($2*I_{dither}$) induces a voltage offset at $V_{out+}$ in addition to the differential output signal ($V_{out+}-V_{out-}$) caused by the differential input signals ($V_{in+}-V_{in-}$) at transistors (502, 504). The negative voltage offsets induced by switches S1 and S2 connecting to nodes N1 and M1 are opposite to the positive voltage offsets introduced by switches S1 and S2 connecting to nodes N2 and M2. Accordingly, the dither circuit (510, 512, 514, 516, 518) can induce offsets between the output terminals $V_{out+}$ and $V_{out-}$ in a first or second direction or can be set so as not to introduce any offset at all.

Table 1 is a truth table of the first and second dither current sources as applied to the negative load, the positive load, or the common node with respect to the node positions of S1 and S2. The negative and positive offsets may range from 0 to $3*I_{dither}$, which in certain embodiments may correspond to 0 to 3 LSBs of the ADC. Thus, Table I illustrates a 2 bit dither control.

TABLE 1

| S1 POSITION | S2 POSITION | POSITIVE OFFSET | NEGATIVE OFFSET | NO OFFSET |
|---|---|---|---|---|
| N1 | M1 | 0 | $3 * I_{dither}$ | 0 |
| N1 | M2 | $2 * I_{dither}$ | $I_{dither}$ | 0 |
| N1 | M3 | 0 | $I_{dither}$ | $2 * I_{dither}$ |
| N2 | M1 | $I_{dither}$ | $2 * I_{dither}$ | 0 |
| N2 | M2 | $3 * I_{dither}$ | 0 | 0 |
| N2 | M3 | $I_{dither}$ | 0 | $2 * I_{dither}$ |
| N3 | M1 | 0 | $2 * I_{dither}$ | $I_{dither}$ |
| N3 | M2 | $2 * I_{dither}$ | 0 | $I_{dither}$ |
| N3 | M3 | 0 | 0 | $3 * I_{dither}$ |

In an embodiment, the amplifier (500) may include a dither control device (520) to control the switching at S1 and S2 so that, at a given time, S1 may be randomly connected to one of N1, N2, N3 nodes, and S2 may be randomly connected to one of M1, M2, M3 nodes. In one embodiment, the random switching at S1 and S2 may occur for each sampling period of an ADC. The dither control device may include two independent random number generators for generating two independent control signals to S1 and S2. In one embodiment, the random numbers may be implemented using a linear feedback shift register (LFSR).

By randomly switching S1 and S2, total 2 bits of dither current may be generated for either side of the differential amplifier with offsets based on dither currents in Table 1. It should be noted that even though the circuit of FIG. 5 uses resistor loads, the effect of dither to the amplifier may be substantially similar to diode connected PMOS devices as loads or other types of load devices. Similar to the differential amplifier shown in FIG. 2, the magnitude of $I_{dither}$ may also be variable based on environmental factors such as the clock frequency, temperature and/or process variables.

The principles of the present invention may be extended beyond two bits. For example, 3 and 4 bits of a dither could be provided by adding additional dither current sources that extend the binary weighting ($4*I_{dither}$ and $8*I_{dither}$ respectively). Thus, the principles present invention accommodates N bits of dither, where N can be tuned to suit individual needs. Two dither current sources may be sufficient for many uses.

Embodiments of the present disclosure provide dither to analog signals in a multi channel digital imaging system to improve matching of channels. The example shown in FIG. 1 uses differential analog signals, but some embodiments of the present invention may be applied to non-differential analog signals as well. In embodiments for non-differential analog signals, dither source may be similarly added in the channels of a multi channel image sensor (e.g., similar to FIG. 4), or channels of a multi channel AFE (e.g., before an SHA, or between an SHA and an VGA, or between an VGA and an ADC, similar to those shown FIG. 1).

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

I claim:

1. A multi channel imaging system, comprising:
an input for a light signal;
a plurality of channel circuits, each having an analog signal processing chain converting some portion of the light signal into to a digital representation, the plurality of channel circuits operating in parallel; and
at least one dither circuit coupled to a point in at least one of the analog signal processing chains to add dither.

2. The multi channel imaging system of claim 1, wherein each analog signal processing chain includes an image sensor that converts light to an analog electrical signal, and the dither is added in the image sensor.

3. The multi channel imaging system of claim 1, wherein each analog signal processing chain includes an analog front end (AFE) that converts an analog electrical signal into a digital signal, and the dither is added in the AFE.

4. The multi channel imaging system of claim 3, wherein each AFE includes a sample and hold circuit, a variable gain amplifier and an analog to digital converter (ADC), dither is added to at least one channel and in at least one point of the AFE.

5. The multi channel imaging system of claim 4, wherein the dither circuit is integrated with the ADC.

6. The multi channel imaging system of claim 5, wherein the dither signal is added to the ADC thresholds.

7. The multi channel imaging system of claim 1, wherein the dither circuit introduces a dither signal with a magnitude that is proportional to a measured channel non-linearity to fix the non-linearity.

8. The multi channel imaging system of claim 1, wherein each of the plurality of channel circuits also include digital processing circuits, and the dither added in the analog signal process chains is removed in the digital processing circuits.

9. The multi channel imaging system of claim 1, wherein the at least one dither circuit introduces a dither signal having a maximum value of one least significant bit (LSB) of an ADC of a respective channel circuit.

10. The multi channel imaging system of claim 1, wherein the dither circuit introduces a dither signal having a maximum value of multiple LSBs of an ADC of a respective channel circuit.

11. The multi channel imaging system of claim 1, wherein each of plurality of channel circuits, converts some portion of the light signal into a differential analog signal and the dither circuit is a differential amplifier.

12. The multi channel imaging system of claim 11, wherein the differential amplifier comprises:
a pair of signal paths, each including a load component and a signal amplification component, the load component coupled to one of a pair of differential outputs, the signal amplification component coupled to one of a pair of differential inputs;
a dither current source selectively coupled to each of the signal paths, the dither current source supplying dither current to the load component of the selected signal path directly by bypassing the amplification component of the selected signal path;
a switch for selectively connecting the dither current source to the signal paths, the switch including three nodes, the first node capable of connecting the dither current source directly to the load in a first signal path, the second node capable of connecting the dither current source directly to the load in a second signal path, and the third node capable of connecting the dither current source to the bias current source; and
a control device coupled to the switch, the control device capable of generating a control signal that triggers the switch to be connected at one of the three nodes at a given time, the control signal being generated based on a random number generator so that the switch is randomly connected at one of the three nodes.

13. A method of matching signal outputs among channels of a multi channel analog front end (AFE), comprising:
adding analog noise to analog signals in each channel of the AFE;
converting the analog signals with the added analog noise completely to digital signals using an analog to digital converter (ADC) of the AFE;
formatting the digital signals from different channels; and
outputting the digital signals.

14. The method of claim 13, wherein each channel of the AFE comprises a sample and hold amplifier (SHA), a variable gain amplifier (VGA) along the channel before the ADC and an dithering unit is to add the analog noise at one of SHA, VGA, between the SHA and VGA of each channel, between the VGA and ADC of each channel.

15. The method of claim 13, wherein the added analog noise has a magnitude proportional to a measured channel non-linearity among the channels of the AFE to fix the non-linearity.

16. The method of claim 13, further comprising removing the added analog noise from the digital signals in digital processing circuits downstream from the AFE.

17. The method of claim 13, wherein the analog signals are differential analog signals and the analog noise is added by a differential amplifier.

18. The method of claim 17, wherein the differential amplifier comprises:
a pair of signal paths, each including a load component and a signal amplification component, the load component coupled to one of a pair of differential outputs, the signal amplification component coupled to one of a pair of differential inputs;

a dither current source selectively coupled to each of the signal paths, the dither current source supplying dither current to the load component of the selected signal path directly by bypassing the amplification component of the selected signal path;

a switch for selectively connecting the dither current source to the signal paths, the switch including three nodes, the first node capable of connecting the dither current source directly to the load in a first signal path, the second node capable of connecting the dither current source directly to the load in a second signal path, and the third node capable of connecting the dither current source to the bias current source; and a control device coupled to the switch, the control device capable of generating a control signal that triggers the switch to be connected at one of the three nodes at a given time, the control signal being generated based on a random number generator so that the switch is randomly connected at one of the three nodes.

19. A method of matching signal outputs among channels of a multi channel imaging system, comprising:

adding analog noise to analog signals in each channel of the multi channel imaging system;

converting the analog signals with the added analog noise completely to digital signals using an analog to digital converter (ADC) in each channel of the multi channel imaging system;

formatting the digital signals from different channels; and outputting the digital signals.

20. The method of claim 19, wherein each channel of the multi channel imaging system comprises an analog front end (AFE), the AFE includes a sample and hold amplifier (SHA), a variable gain amplifier (VGA) along the channel before the ADC.

21. The method of claim 20, wherein an dithering unit is to add the analog noise at one of SHA, VGA, between the SHA and VGA of each channel, between the VGA and ADC of each channel, and thresholds for the ADC.

22. The method of claim 19, wherein the added analog noise has a magnitude proportional to a measured channel non-linearity among the channels of the multi channel imaging system to fix the non-linearity.

23. The method of claim 19, further comprising removing the added analog noise from the digital signals in digital processing circuits of the multi channel imaging system.

24. The method of claim 19, wherein the analog signals are differential analog signals and the analog noise is added by a differential amplifier.

25. A multi channel image sensor, comprising:

a pixel array including a plurality of pixel sensors, each pixel sensor generating analog signals upon incident of light;

a plurality of output channels; and a dither unit to add analog noise to the generated analog signals in each channel of the image sensor.

26. The multi channel image sensor of claim 25, wherein the dithering unit is to add the analog noise to an amplifier driving the output of the image sensor.

27. The multi channel image sensor of claim 25, wherein the analog signals are differential analog signals and an dither unit to add the analog noise is a differential amplifier.

28. The multi channel image sensor of claim 27, wherein the differential amplifier comprises:

a pair of signal paths, each including a load component and a signal amplification component, the load component coupled to one of a pair of differential outputs, the signal amplification component coupled to one of a pair of differential inputs;

a dither current source selectively coupled to each of the signal paths, the dither current source supplying dither current to the load component of the selected signal path directly by bypassing the amplification component of the selected signal path;

a switch for selectively connecting the dither current source to the signal paths, the switch including three nodes, the first node capable of connecting the dither current source directly to the load in a first signal path, the second node capable of connecting the dither current source directly to the load in a second signal path, and the third node capable of connecting the dither current source to the bias current source; and a control device coupled to the switch, the control device capable of generating a control signal that triggers the switch to be connected at one of the three nodes at a given time, the control signal being generated based on a random number generator so that the switch is randomly connected at one of the three nodes.

29. A method of matching signal outputs among channels of a multi channel image sensor, comprising:

generating differential analog signals by pixel sensors upon incident of light; and adding analog noise to analog signals by a differential amplifier, wherein the differential amplifier comprises:

two symmetrical signal paths, each including a load component and a signal amplification component, the load component coupled to one of a pair of differential outputs, the signal amplification component coupled to one of a pair of differential inputs; and dither current source selectively coupled to each of the signal paths, the dither current source supplying dither current to the load component of the selected signal path directly by bypassing the amplification component of the selected signal path.

30. The method of claim 29, wherein the differential amplifier is to add the analog noise to an amplifier driving the output of the image sensor.

* * * * *